(12) United States Patent
Wu et al.

(10) Patent No.: US 11,320,465 B2
(45) Date of Patent: May 3, 2022

(54) METHOD OF INSPECTING POWER UNITS

(71) Applicant: DELTA ELECTRONICS, INC., Taoyuan (TW)

(72) Inventors: Chih-Ming Wu, Taoyuan (TW); Chien-Yu Lin, Taoyuan (TW); Tsung-Hsun Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 30 days.

(21) Appl. No.: 17/016,316

(22) Filed: Sep. 9, 2020

(65) Prior Publication Data
US 2021/0349130 A1    Nov. 11, 2021

(30) Foreign Application Priority Data
May 11, 2020    (CN) .......................... 202010391732.3

(51) Int. Cl.
*G01R 19/00*    (2006.01)
*G01R 19/165*    (2006.01)

(52) U.S. Cl.
CPC ..... *G01R 19/003* (2013.01); *G01R 19/16542* (2013.01)

(58) Field of Classification Search
CPC .......................... G01R 19/003; G01R 19/16542
See application file for complete search history.

(56) References Cited

U.S. PATENT DOCUMENTS

| | | | |
|---|---|---|---|
| 10,082,856 B1 * | 9/2018 | Owen | ...................... G06F 1/263 |
| 2020/0025808 A1 * | 1/2020 | Khlat | ............... G01R 19/16542 |

* cited by examiner

*Primary Examiner* — Daniel C Puentes
(74) *Attorney, Agent, or Firm* — Chun-Ming Shih; HDLS IPR Services

(57) ABSTRACT

A method of inspecting power units applied to a plurality of power units is connected to a signal bus. The method is to disconnect the power unit having an output current from the signal bus, give a control command by a controller for raising the output current, measure the output current after the control command is given, and compare the measured output current with the target current value corresponding to the control command for determining an inspection result. The present disclosed example can effectively reduce inspection time and improve inspection accuracy.

18 Claims, 12 Drawing Sheets

METHOD OF INSPECTING POWER UNITS

BACKGROUND OF THE INVENTION

Field of the Invention

The technical field relates to power units, and more particularly, to the inspection of the power units.

Description of Related Art

A conventional method of inspecting power units is to check whether the output current of the power unit can reach the expected current value as a reference to determine the performance of the power unit.

The existing method of inspecting power units have the problems of the process being too long, accuracy being too low, and the overcurrent protection being too easily triggered during inspection.

Additionally, in the case of inspecting power units with an existing current sharing method, which is to arrange a plurality of power units to be connected to a signal bus as a feedback medium for current sharing, due to the effects of current sharing, the existing method of inspecting power units is unable to adjust the output current of the power units through adjusting the reference voltage of the voltage control circuit of the power units.

SUMMARY OF THE INVENTION

The present disclosed example provides a method of inspecting power units with the ability to raise the output current through a direct control command for inspecting the performance of the power unit.

In one of the exemplary embodiments, a method of inspecting power units for a plurality of power units connected to a signal bus is provided. Each power unit comprises a power module and a controller, and the method comprises the following steps: disconnecting one of the power units from the signal bus, wherein the power unit being disconnected has an output current; providing a control command from the controller for raising the output current; measuring the output current after the control command is provided; and determining an inspection result of the power unit by comparing the measured output current with a target current value corresponding to the control command.

The present disclosed example can effectively reduce inspection time, improve inspection accuracy and eliminate the current effects of current sharing during inspection.

BRIEF DESCRIPTION OF THE DRAWINGS

The features of the present disclosed example believed to be novel are set forth with particularity in the appended claims. The present disclosed example itself, however, may be best understood by reference to the following detailed descriptions of the present disclosed example, which describes an exemplary embodiment of the present disclosed example, taken in conjunction with the accompanying drawings, in which:

DETAILED DESCRIPTION OF THE INVENTION

Figure 1:
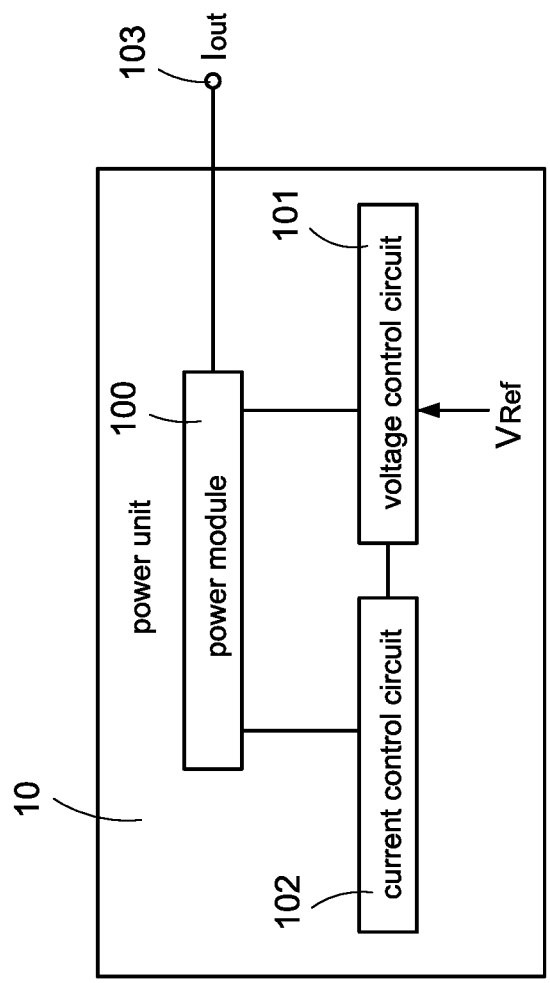
FIG. 1 illustrates an architecture diagram of a power unit of related art.
Figure 2:
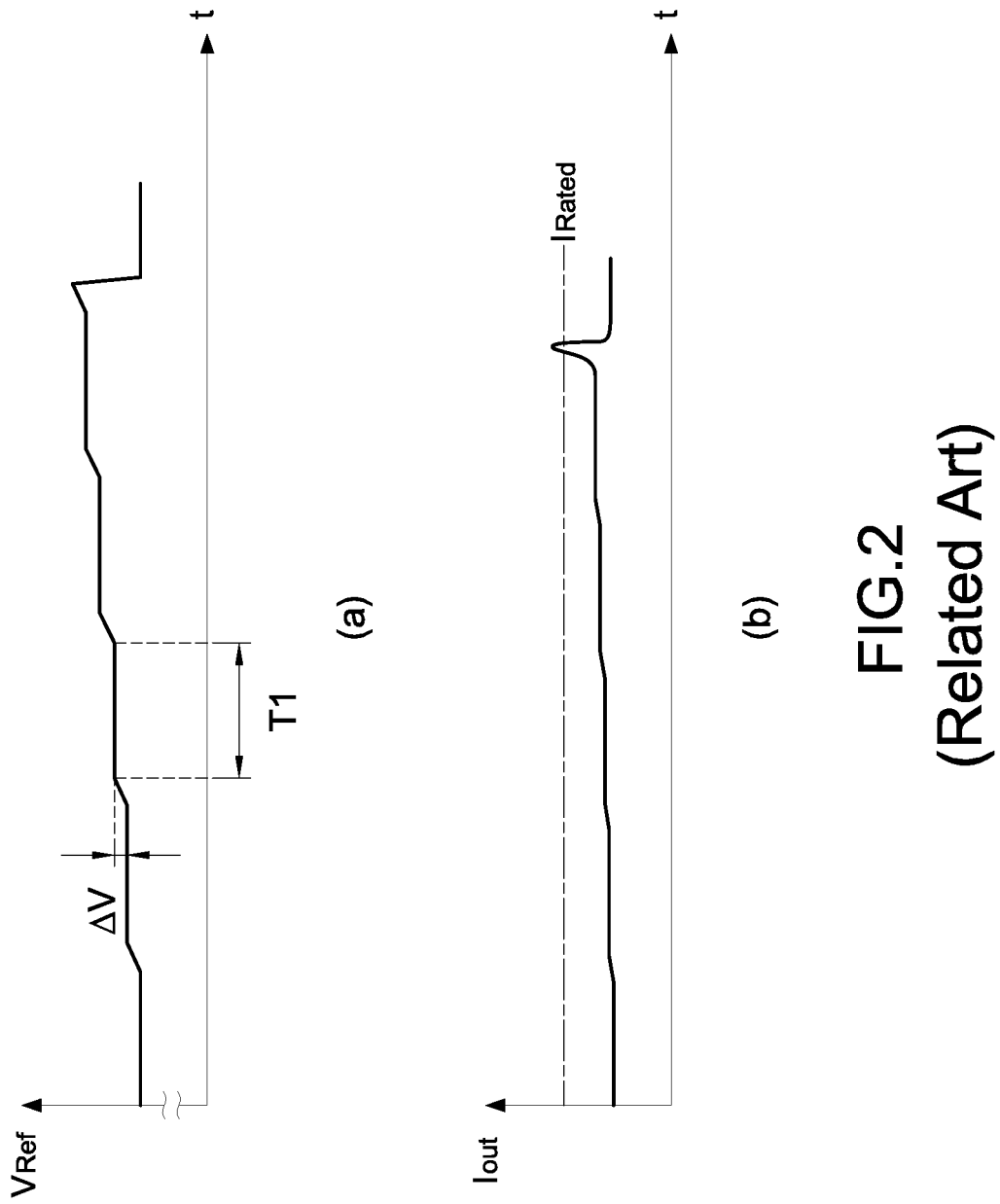
FIG. 2 illustrates a relation chart of voltage control command and time and a relation chart of output current and time based on the existing performance inspection for the power unit of related art.
Figure 3:
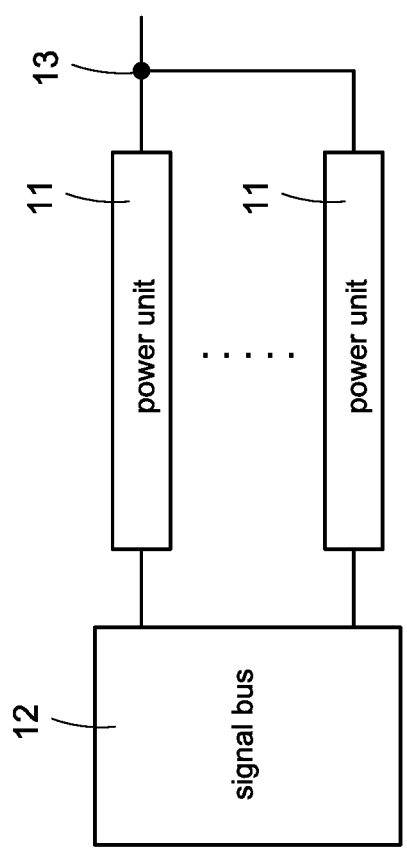
FIG. 3 illustrates an architecture diagram of a power apparatus of related art.

FIG. 1 to FIG. 3 are used to explain the problems solved by the present disclosed example and disadvantages of the existing method of inspecting power units more specifically.

As shown in FIG. 1, a power unit 10 may comprise a power module 100, a voltage control circuit 101, a current control circuit 102, and an output port 103 electrically connected to each other.

One of existing method of inspecting power units is to adjust the reference voltage $V_{Ref}$ of the voltage control circuit 101, raising the output voltage of the power unit 10 so as to check whether the output current $I_{out}$ of the output port 103 will rise along with the output voltage.

Because the performance of the power unit 10 cannot be known before an inspection, the method of inspecting power units cannot directly select the most appropriate reference voltage $V_{Ref}$. More specifically, when the reference voltage $V_{Ref}$ is too high and makes the output current $I_{out}$ excessively high, the Over Current Protection (OCP) mechanism of the power unit 10 may be triggered automatically, shutting down the power unit 10 and causing the inspection to fail.

To prevent the above problem, as shown in FIG. 2, the existing method of inspecting power units slowly raises the reference voltage $V_{Ref}$ from a lower value. For example, an existing method of inspecting performance of power units raises the reference voltage $V_{Ref}$ with a designated voltage variation $\Delta V$, and waits for a designated time interval T1

(such as 10 seconds). If the output current does not reach the rated current $I_{Rated}$, the reference $V_{Ref}$ is raised again with the voltage variation $\Delta V$ until the output current reaches the rated current $I_{Rated}$ (normal performance), or the reference $V_{Ref}$ reaches a maximum voltage within the adjustable range (abnormal performance).

The above method of inspecting power units has the problems of a long inspection time (it is necessary to wait for the completion of current variation after every time the reference voltage $V_{Ref}$ is adjusted), low adjustment accuracy (for example, an inspection result may be determined as abnormal because of a given unsuitable reference voltage $V_{Ref}$, or the output current $I_{out}$ may be determined as normal due to an current surge reaching the rated current threshold $I_{Rated}$), and triggering the overcurrent protection too easily (such as being triggered by the current surge) during inspection.

As shown in FIG. 3, when a plurality of power units 11 installed in the power apparatus are connected in parallel and a current-sharing port of each power unit 11 is coupled to a signal bus 12 as a feedback medium for current sharing, due to the effects of current-sharing, the output currents outputted by the power units 11 are configured to be the same such that the existing method of inspecting power units is unable to be applied to power apparatuses with a signal bus for current sharing.

To solve the above problem, the present disclosed example provides a power apparatus and a method of inspecting a power unit applied to this power apparatus which has the ability to execute a performance inspection on power apparatuses with a signal bus based on current control and accurately raises the output current without triggering the overcurrent protection mechanism.

Figure 4:
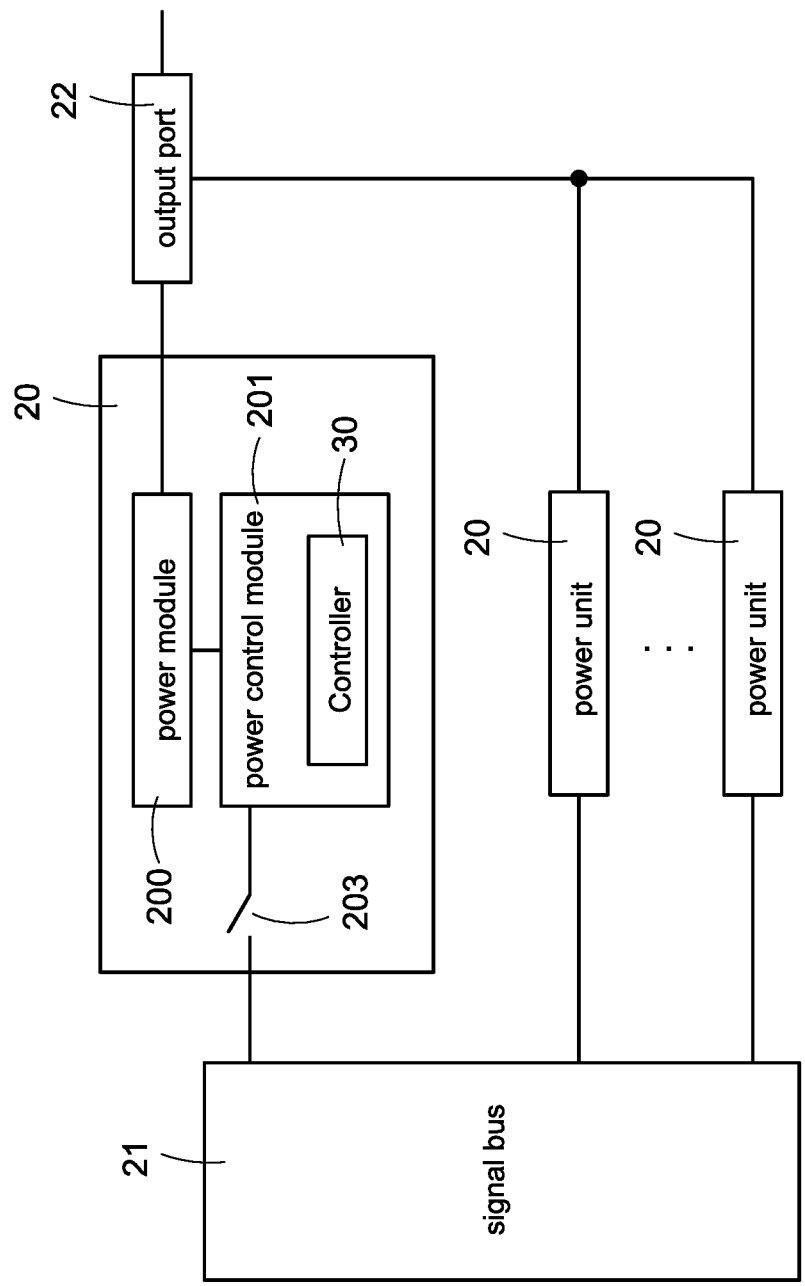
FIG. 4 illustrates an architecture diagram of a power apparatus of the first implementation of the present disclosed example.

As shown in FIG. 4, the power apparatus of the present disclosed example comprises a plurality of power units 20. The output ports of the power units 20 are coupled to each other in parallel, and a current-sharing port of each power unit 20 is coupled to a signal bus 21. Via the effect of the signal bus 21, the power apparatus is able to provide the stable electricity output (namely, the stable output voltage and the stable output current) at the output port 22 (such as a cable, an electrical connector or an electrical port, etc.)

Each power unit 20 comprises a power module 200 and a power control module 201 electrically connected to each other.

The power module 200 (which may comprise a battery and/or a device for coupling to an external power source) is used to provide electricity. The power control module 201 (which may comprise a microprocessor or other electronic circuits) is used to adjust the output electricity (such as output voltage and/or output current) of the power module 200.

In the present disclosed example, the power control module 201 comprises a controller 30. The controller 30 is used to give a control command to the power control module 201 for adjusting the output current of the power module 200. The above control command may be one set of control signals and correspond to a target current (value), and the control command may be used to control the power control module 201 to adjust the output current of the power module 200 to the target current (value) designated by this control command.

In the present disclosed example, the power unit 20 further comprises a switch 203 used to connect the power control module 201 to the signal bus 21. The power control module 201 may switch on the switch 203 to connect the power control module 201 to the signal bus 21 in the power unit 20 to enable the effect of current-sharing, or switch off the switch 203 to disconnect the power control module 201 from the signal bus 21 in the power unit 20 to disable the effect of current-sharing.

The present disclosed example can successfully execute the performance inspection via switching off the switch 203 to disable the effect of current-sharing.

Figure 5:
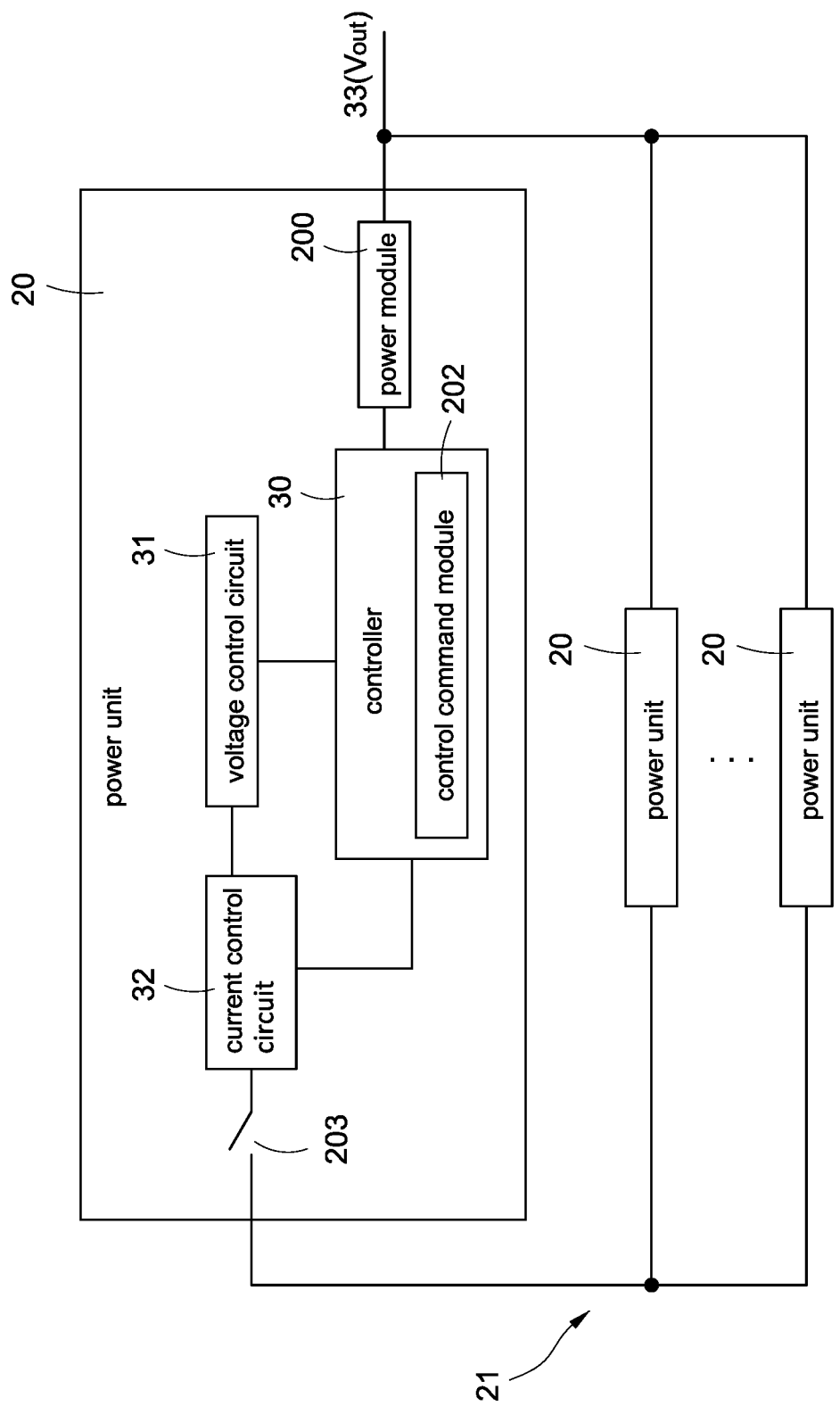
FIG. 5 illustrates an architecture diagram of a power apparatus of the second implementation of the present disclosed example.

As shown in FIG. 5, the power control module 201 may comprise a controller 30, a voltage control circuit 31 and a current control circuit 32 electrically connected to each other. The symbol $V_{out}$ expresses the output voltage at the output port 33 of the power apparatus.

The controller 30 is used to control the output voltage and the output current of the power module 200, and can monitor the performance of the power module 200. The voltage control circuit 31 is used to adjust the output voltage of the power module 200. The current control circuit 32 is used to adjust the output current of the power module 200.

More specifically, the controller 30 is connected to the current control circuit 32 and comprises a control command module 202, and can generate the control command using the control command module 202 and provide the generated control command to the current control circuit 32, such that the current control circuit 32 executes the control command. The current control circuit 32 is further connected to the switch 203 which can be controlled by the controller 30, and the current control circuit 32 is connected to the signal bus 21 though the switch 203 to enable or disable the effect of current-sharing.

In one of the implementations, the controller 30 may comprise a storage, such as registers, read-only memory (ROM), flash memory, or other non-transient storage media. The above-mentioned storage may store the correspondence relationships between a plurality of different control commands and a plurality of different target current values. These different target current values respectively correspond to the different types of power units 20 or power apparatuses. The controller 30 may select the coincident target current value corresponding to the type (such as model number, performance, etc.) of the power unit 20 or the power apparatus being inspected, and generate the corresponding control command based on this correspondence relationship. Namely, the controller 30 can select the correspondence relationship of the control command used to adjust the output current of the power module 200 to the target current value.

In one of the implementations, the above-mentioned correspondence relationships may be generated based on the characteristics of the different types of power apparatuses or power modules 200 by repeated experimentation, calculation and statistics, and be pre-stored in the storage of the controller 30 before the power apparatus leaves the factory. Each control command may accurately control the corresponding type of the power apparatus or the power module 200 to adjust its output current to reach a pre-stored target current value.

In one of the implementations, the above-mentioned correspondence relationship is recorded in a form of lookup table, and the lookup table is stored in the above-mentioned storage.

In one of the implementations, the controller 30 is connected to the current control circuit 32 though a signal line (cable), and the control command module 202 may be a software control module (such as computer program) or a circuit control module implemented in the controller 30.

The voltage control circuit 31 and the current control circuit 32 are connected to each other and influence each other. Namely, when the voltage control circuit 31 changes the output voltage $V_{out}$ of the power unit 20 to change the output current, the current control circuit 32 can further influence the voltage control circuit 32 based on the current variation of the output current (such as through one set of signals corresponding to the output current, as the sensing signal $I_{out\_sense}$ of output current shown in FIG. 6 and FIG. 7, as feedback to the current control circuit 32) to change the output voltage $V_{out}$. Thus, the present disclosed example can accurately raise the output current to reach the above-mentioned target current value.

Figure 6:
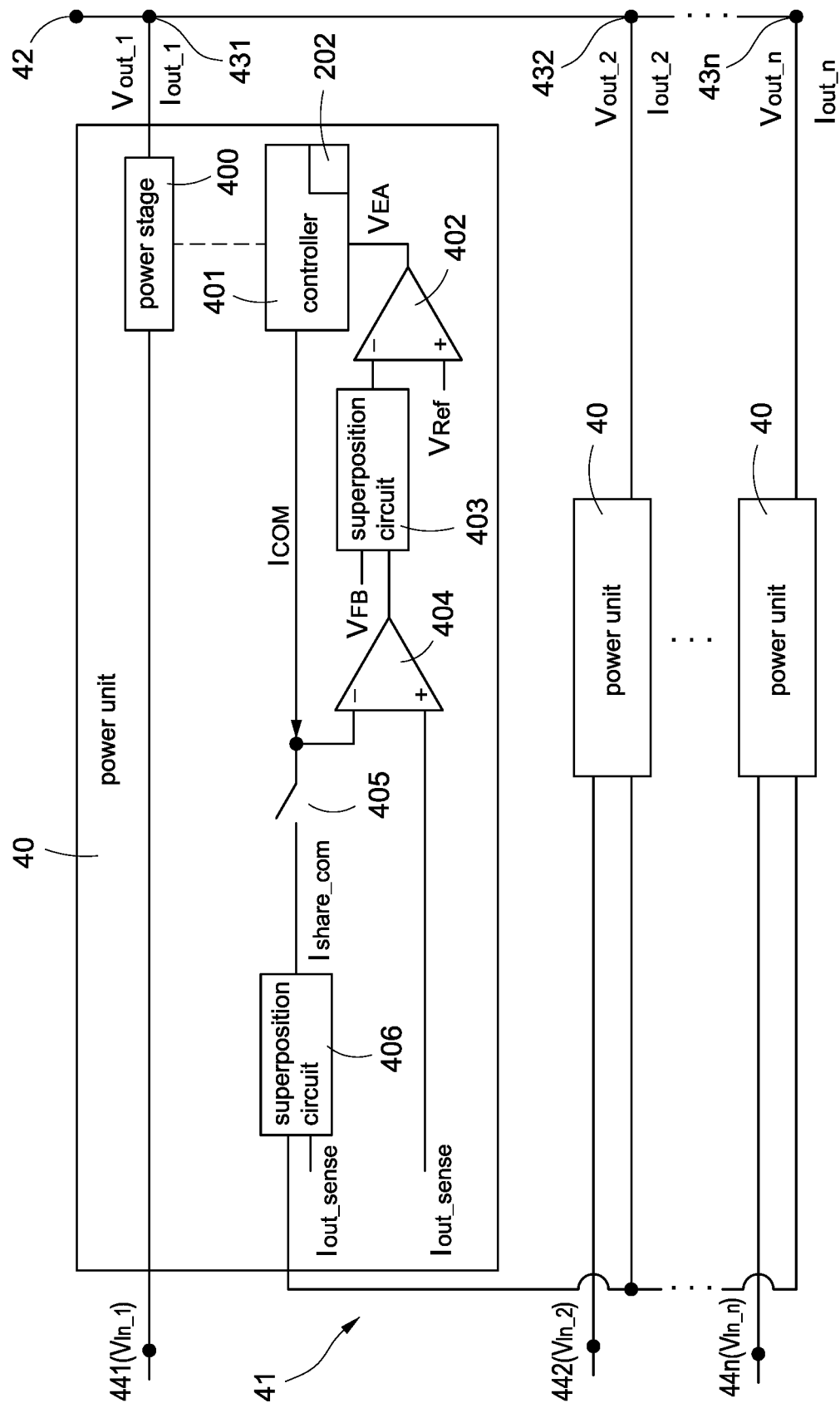
FIG. 6 illustrates an architecture diagram of a power apparatus of the third implementation of the present disclosed example.

Please refer to FIG. 6, the controller 401 is the same as or similar to the above-mentioned controller 30.

In FIG. 6, each power unit 40 is a power supply, the above-mentioned power module 200 may comprise a power stage 400 electrically connected to the controller 401, and the power stage 400 is used to convert the electricity inputted from the input ports 441-44n (namely, the ports 441-44n respectively with input voltages $V_{In\_1}, V_{In\_2}, \ldots, V_{In\_n}$) into the electricity meeting the specification (such as a designated output voltage value or output current value) of the output port 42 connected with the output ports 431-43n of the power units 40 respectively having output voltages $V_{out\_1}, V_{out\_2}, \ldots, V_{out\_n}$.

Each of the above-mentioned input ports 441-44n with the input voltages $V_{in\_1}, V_{in\_2}, \ldots, V_{In\_n}$ may be a cable, electrical connector or electrical port, etc., and may be connected to a power source for receiving the inputted electricity, such as a commercial power supply or generator.

Each of the power units 40 respectively has the output current $I_{out\_1}, I_{out\_2}, \ldots, I_{out\_n}$, and respectively has the output voltage $V_{out\_1}, V_{out\_2}, \ldots, V_{out\_n}$.

The current control circuit 32 comprises a superposition circuit 406 and a differential amplifier 404. The signal bus 41 is connected to the superposition circuit 406 and the superposition circuit 406 is connected to the differential amplifier 404 though the switch 405.

The control command ICOM, the sensing signal of output current $I_{out\_sense}$, the control signal of current-sharing $I_{share\_com}$, and the signal of the signal bus 41 may be implemented as an analog voltage signal, and the purpose of these signals is to adjust the output current $I_{out\_1}, I_{out\_2}, \ldots, I_{out\_n}$. For example, the analog voltage signal may be used to represent the output current value, such as the read value of the output current or the average output current value on the signal bus.

The above-mentioned control commands may be analog voltage signals with different voltage values. Namely, the above-mentioned storage may record the correspondence relationship between the control commands with different voltage values and the different target current values, for example, the control command with a voltage value of 1.2 V may correspond to a target current value of 50 A. This implementation is able to select the proper control command for the current power apparatus to accurately and quickly adjust the output current to the target current value.

For different types of power apparatuses, the same control command may correspond to different target current values. For example, the control command with a voltage value of 1.2V may correspond to the target current value of 50 A for the first power apparatus, but correspond to the target current value of 30 A for the second power apparatus.

When the switch 405 is switched on (creating a closed circuit), the negative port of the differential amplifier 404 is connected to the super position circuit 406 which receives the sensing signals $I_{out\_sense}$ of the output current of the power units 40 and the signal of the signal bus 41. The value of each sensing signal $I_{out\_sense}$ may be proportional to the read value of the output current $I_{out\_1}, I_{out\_2}, \ldots, I_{out\_n}$ of each power unit 40 and be configured to be fed back to the current control circuit 32. After the above-mentioned signal of the signal bus 41 and the sensing signals $I_{out\_sense}$ of the output current of each power unit 40 are superimposed by the superposition circuit 406, a control signal $I_{share\_com}$ for current-sharing is generated by the superposition circuit 406 and used to indicate the average current value of the power units 40. Then, the comparison result (which may be a voltage signal) of the control signal $I_{share\_com}$ and the sensing signals $I_{out\_sense}$ processed by the differential amplifier 404 is inputted to the voltage control circuit 31 to adjust the output voltage $V_{out\_1}, V_{out\_2}, \ldots, V_{out\_n}$. This way, each output current $I_{out\_1}, I_{out\_2}, I_{out\_n}$ changes with the variation of the corresponding output voltage in response to the current-sharing mechanism.

When the switch 405 is switched off (creating an open circuit), the effect of the signal bus 41 is removed from the current control circuit 32. Namely, the control signal $I_{share\_com}$ for current sharing is removed. The control command ICOM newly introduced by the present disclosed example and the sensing signals $I_{out\_sense}$ of the output current are directly inputted to the differential amplifier 404. Then, the comparison result processed by the differential amplifier 404 is inputted to the voltage control circuit 31 to adjust the output voltage $V_{out\_1}, V_{out\_2}, \ldots, V_{out\_n}$. This way, each output current $I_{out\_1}, I_{out\_2}, \ldots, I_{out\_n}$ changes with the variation of the corresponding output voltage in response to the control command ICOM.

The voltage control circuit 31 comprises a superposition circuit 403 and a differential amplifier 402. This implementation controls the power unit 40 by following means: the superposition circuit 403 executing the superposition process on the comparison result of the differential amplifier 404 and the feedback voltage $V_{FB}$ based on the default weightings (when the switch 405 is switched on, the comparison result is the amplified difference between the value of the control signal $I_{share\_com}$ for current sharing and the value of the sensing signals Iout_sense of the output current; when the switch 405 is switched off, the comparison result is the amplified difference between the value of the control command ICOM and the value of the sensing signals $I_{out\_sense}$ of output current); the differential amplifier 402 comparing the superimposed result (which may be a voltage signal) of the superposition circuit 403 with the reference voltage $V_{Ref}$ to obtain an error voltage $V_{EA}$; the controller 401 controlling the output voltage $V_{out\_1}, V_{out\_2}, \ldots, V_{out\_n}$ of the power unit 40 based on the error voltage $V_{EA}$, and the output current $I_{out\_1}, I_{out\_2}, \ldots, I_{out\_n}$ being adjusted with the output voltage $V_{out\_1}, V_{out\_2}, \ldots, V_{out\_n}$.

The existing method of inspecting power units slightly raise the reference voltage $V_{Ref}$ for several times to gradually raise each output voltage $V_{out\_1}, V_{out\_2}, \ldots, V_{out\_n}$, such that the output current $I_{out\_1}, I_{out\_2}, \ldots, I_{out\_n}$ is gradually raised. Such method for changing the output current has a longer response time, and the adjusted current value is unpredictable such that the overcurrent protection mechanism is easily triggered.

Compared to the existing technology, in the present disclosed example, the reference voltage $V_{Ref}$ may be configured as a fixed value which may be determined based on the type of the power apparatus. Via the above-mentioned correspondence relationships, the present disclosed example directly obtains one control command ICOM (analog voltage value) with the ability to adjust the output current $I_{out\_1}, I_{out\_2}, \ldots, I_{out\_n}$ of the power apparatus to reach the target current value quickly and safely. After the switch 405 is switched off (creating an open circuit), the controller 401 uses the control command module 202 to give the control command ICOM to the differential amplifier 404 and directly raises the output current $I_{out\_1}, I_{out\_2}, \ldots, I_{out\_n}$ to the target current value.

Figure 7:
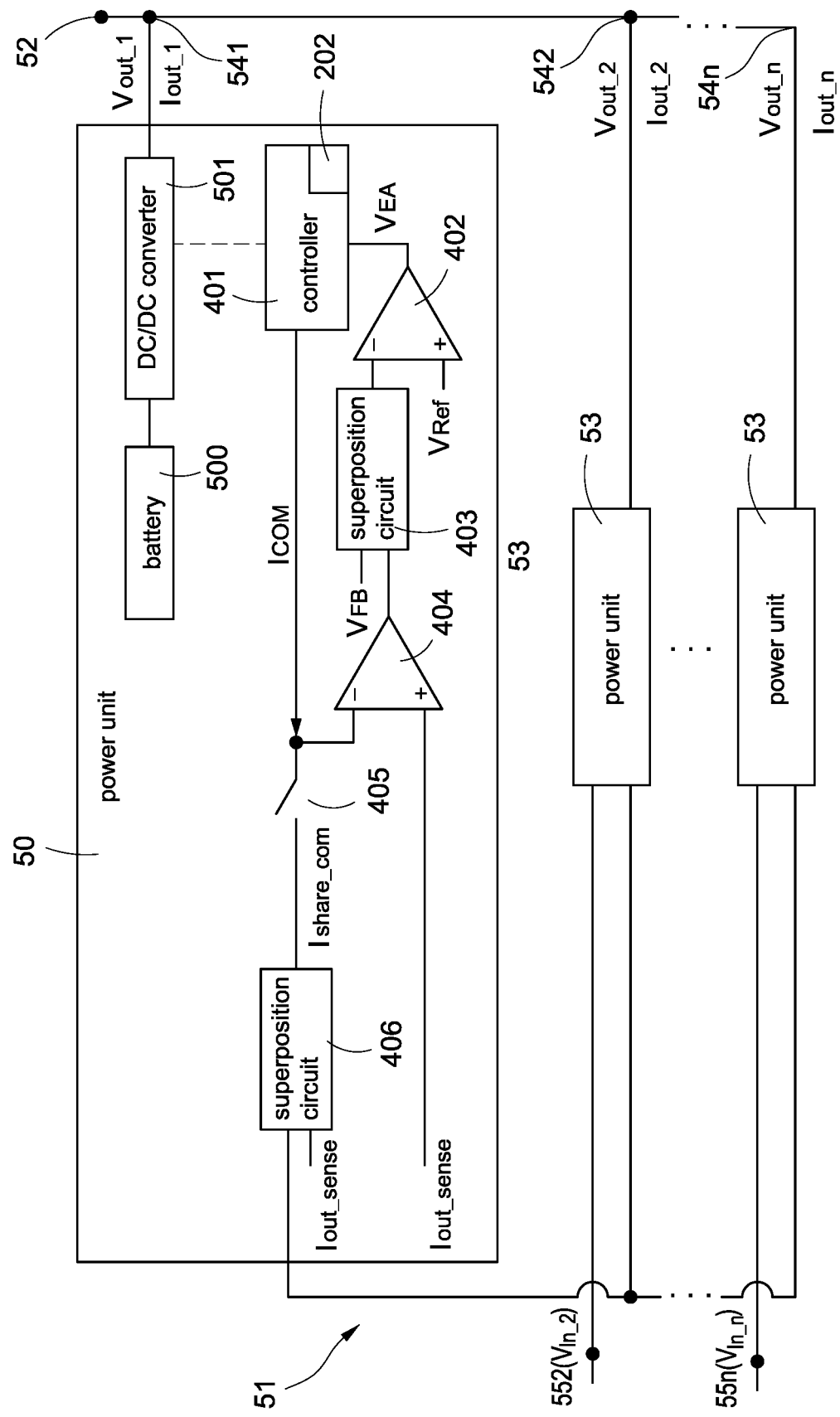
FIG. 7 illustrates an architecture diagram of a power apparatus of the fourth implementation of the present disclosed example.

In comparison with the implementation shown in FIG. 6, in the implementation shown in FIG. 7, the power unit 50 is a power storage device, such as a backup battery device, that operates without external electricity input.

The power module comprises the battery 500 and the DC/DC converter 501. The battery 500 is used to store and provide electricity, and the DC/DC converter 501 is used to convert the electricity from the battery 500 into the electricity meeting the DC power specification of the output current $I_{out\_1}$ and/or the output voltage $V_{out\_1}$ at the output port 541.

Each power units 53 having the input port 552-55$n$ respectively with the input voltage $V_{In\_2}$-$V_{In\_n}$ and the output port 542-54$n$ respectively with the output current $I_{out\_2}$-$I_{out\_2}$ and/or the output voltage $V_{out\_2}$-$V_{out\_n}$ is a power supply, the output ports of the power unit 50 and the power units 53 are coupled to each other in parallel, and their current-sharing ports are coupled to the signal bus 51. When the input power source fails (namely, the power unit 53 fails to receive the electricity), the power apparatus of the present disclosed example may still provide the electricity using the power unit 50.

In one of the implementations, all of the power units 50 of the power apparatus may be power storage devices.

In addition, the above-mentioned method of inspecting power units using the control command ICOM to directly adjust the output current of the power units is not limited to the power apparatuses with current-sharing signal bus. In other words, in one embodiment, this method of inspecting power units can be applied to a standalone power unit without a current-sharing bus with skipping the step of switching off the switch 405 to disable the effect of current sharing. Furthermore, in another embodiment, this method of inspecting power units can also be applied to power apparatuses of different current sharing systems (with or without current-sharing signal bus) connected in parallel, as long as the power units to be inspected do not share the same current-sharing signal bus.

Please refer to FIG. 8, which displays the method of inspecting a power unit of each embodiment of the present disclosed example (hereinafter the method for abbreviation) that may be implemented by any of the power apparatuses shown in FIG. 4 to FIG. 7. The following description takes the power apparatus shown in FIG. 5 for example.

The method of each embodiment of the present disclosed example may be implemented by the means of hardware (such as using a circuit board, integrated circuit or SoC) or the means of software (such as using firmware, an application program or other computer programs). When implemented by software means, the controller may comprise a non-transitory computer-readable media which stores the computer program recording computer-readable codes. When the controller executes the computer program, the controller may control the power apparatus to execute the following steps.

The method of this embodiment comprises the following steps:

Step S10: the controller 30 (controlled by the external device or triggered automatically) of one of the power units 20 controls the power unit 20 to be disconnected from the signal bus 21 (by switching off the switch 203), so as to remove the effect of current sharing from the output current of the power unit 20.

Step S11: the controller 30 provides the control command using the control command module 202 to the current control circuit 32, and the current control circuit 32 executes the control command. The control command is used to raise the output current of the power unit 20 to the target current value corresponding to the power unit 20. The target current value may be configured based on the rated current of the power unit 20, such as being 80%, 90% or 97% etc. of the rated current.

In general, the performance of a power unit will gradually deteriorate with use. However, even if the output current of the power unit is unable to reach 100% of the rated current, this power unit is still able to work and can save maintenance costs as long as the deterioration is not serious enough, for example, the maximum output current of the power unit can still reach 80% of the rated current.

Besides, even if the performance of a brand-new power unit may not be able to reach 100% of the rated current, which may be caused by inconsistency of the manufacturing process or yield rate, damage during transportation, or other problems, the power unit is still usable and can operate normally.

Thus, if the target current value is configured as 100% of the rated current, the above-mentioned usable power units may be misjudged as having abnormal performance and need to be replaced, which would increase unnecessary maintenance costs. With regard to this problem, the present disclosed example can effectively prevent the misjudgment via configuring the target current value as a value close to but less than the rated current.

In one of the exemplary embodiments, the user can operate an external computer connected to the control command module 22, and give the control command to the controller 30 via the external computer.

In one of the exemplary embodiments, after the power unit 20 is switched to the inspection mode (automatically or in response to the user's manual operation), the controller 30 may execute the control command module 202 to load the control command pre-stored in the storage, and automatically give this control command. For example, after the target current value is determined, the controller 30 may obtain the control command corresponding to the determined target current value based on the above-mentioned correspondence relationship between the control commands and the target current values.

Then, the current control circuit 32 responds to the control command immediately, and attempts to quickly raise the output current to reach the target current value. The details of the means of adjustment is in the explanations of FIG. 3 to FIG. 7.

Step S12: the controller 30 measures the output current (such as the output current $I_{out}$ shown in FIG. 6 or FIG. 7) of the power unit 20.

In one of the exemplary embodiments, the controller 30 measures the current value of the output port of the power module 20 as the output current.

Step S13: the controller 30 compares the measured output current with the target current value to determine the inspection result of the power unit 20.

In one of the exemplary embodiments, as shown in FIG. 6, when the power unit is a power supply, the controller 30 is configured to compare the output current $I_{out\_1}, I_{out\_2},$ $I_{out\_n}$ with the target current value corresponding to the power supply (such as being 90% of the rated current of the power supply).

In one of the exemplary embodiments, as shown in FIG. 7, when the power module is a battery module (namely, comprising the battery 500 and the DC/DC converter 501), the controller 401 is configured to compare the output current $I_{out\_1}, I_{out\_2}, \ldots, I_{out\_n}$ with the target current value corresponding to the battery 500 or the DC/DC converter 501 (such as being 98% of the rated current of the battery 500 or the DC/DC converter 501).

In this way, the present disclosed example can effectively reduce inspection time, improve inspection accuracy and eliminate the effect of current-sharing during inspection.

Figure 9:
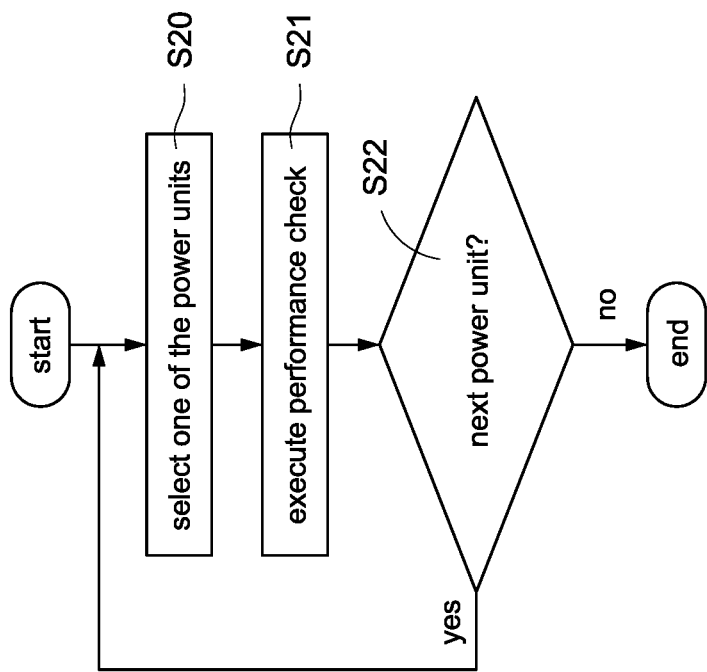
FIG. 9 illustrates a partial flowchart of the method of inspecting the power unit of the second embodiment of the present disclosed example.
Figure 8:
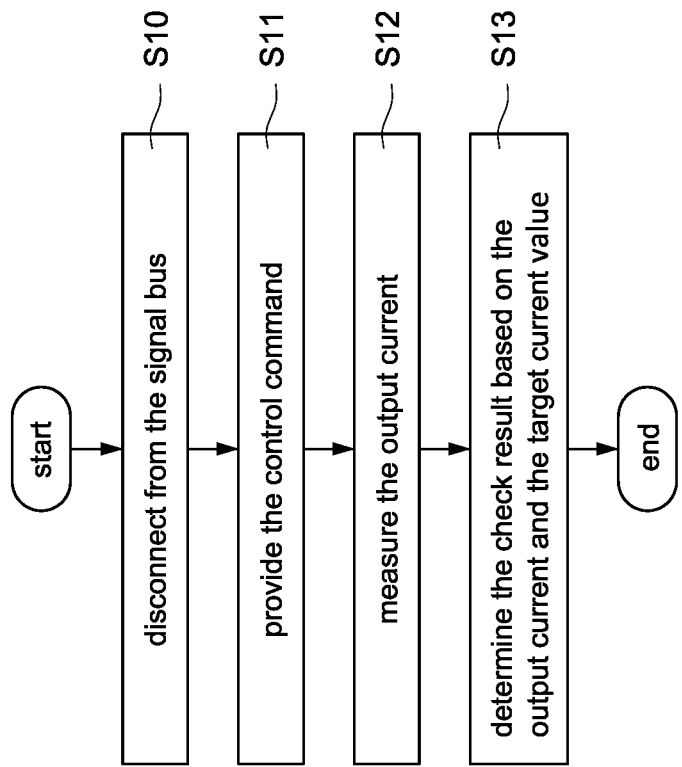
FIG. 8 illustrates a flowchart of the method of inspecting the power unit of the first embodiment of the present disclosed example.

In comparison with the embodiment shown in FIG. 8, the embodiment in FIG. 9 further provides a method with an auto-switch function that is able to automatically switch the power units 20 of the power apparatus to be inspected. More specifically, the method of this embodiment comprises following steps.

Step S20: the external test program or the controller 30 selects one of the power units 20 to be inspected. The external test program may be installed in an external test computer, and the external test computer is connected to the controller 30 of each power unit 20 (by cables). The external test program or the controller 30 may select the power unit 20 that has not an inspection result yet, such as selecting the first power unit 20, or selecting the power unit 20 with the longest interval since the last inspection, etc.

Figure 10:
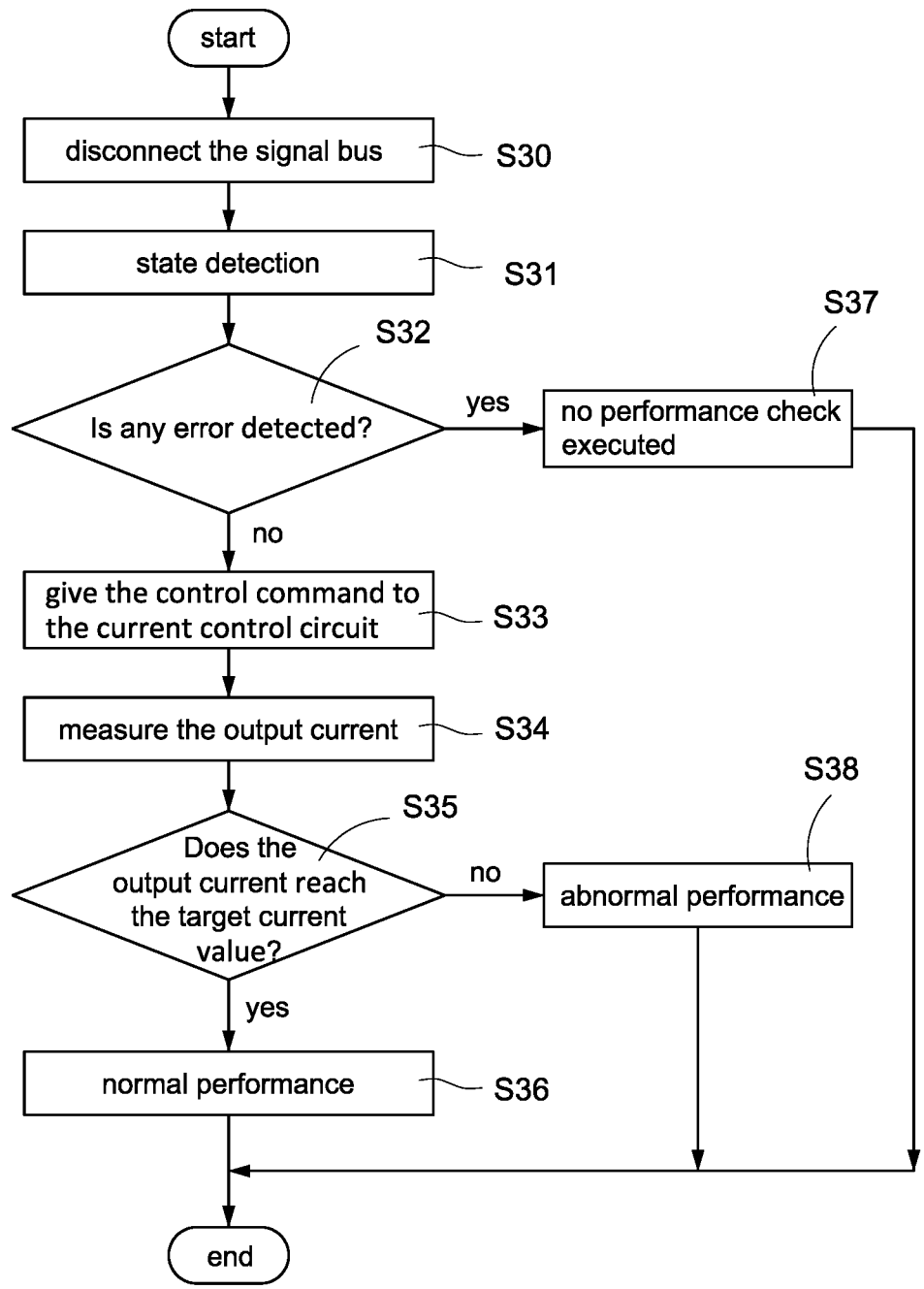
FIG. 10 illustrates a flowchart of the method of inspecting the power unit of the third embodiment of the present disclosed example.
Figure 11:
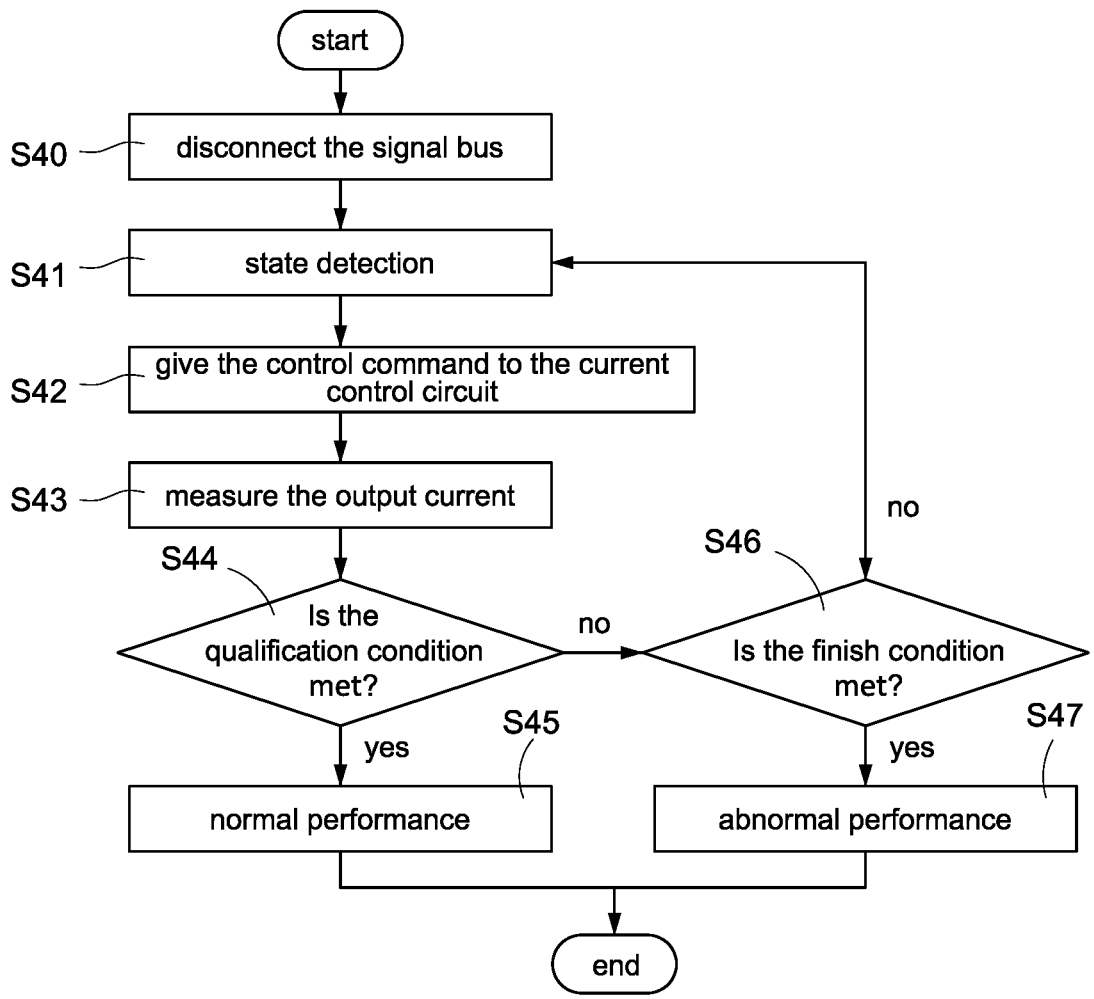
FIG. 11 illustrates a flowchart of the method of inspecting the power unit of the fourth embodiment of the present disclosed example.

Step S21: the controller 30 executes the performance inspection of the present disclosed example, such as executing the steps S10-S13 shown in FIG. 8, the steps S30-S38 shown in FIG. 10, or the steps S40-S47 shown in FIG. 11.

In the performance inspection, the switch 203 is controlled to be turned off to remove the effect of current-sharing of the signal bus 21 from the selected power unit 20, and the controller 30 gives the control command to the current control circuit 32 of the selected power unit 20, measures the output current of the selected power unit 20, and determines the performance of the selected power unit 20 based on the responding output current.

Step S22: the external test program or the controller 30 determines whether there is any other power unit 20 to be inspected after the performance inspection of the selected power unit 20 is completed.

If there is any power unit 20 to be inspected, step S20 is executed again to select another power unit 20 to be inspected to execute the performance inspection. Otherwise,—the power apparatus inspection is finished.

The present disclosed example according to the embodiment in FIG. 9 can automatically inspect the power units of the same power apparatus, which saves the need of the user's manual operation to switch the power unit, saving the total inspection time.

The following description uses FIG. 6 to explain the method shown in FIG. 10, but a person skilled in the art of the present disclosed example should be able to understand that the method of this embodiment can be implemented by any of the power apparatuses shown in FIG. 4 to FIG. 7.

The method of this embodiment further provides a state detection function (steps S31-S32) which is able to detect whether the power apparatus comprising the power units 40 is operating normally before the execution of the performance inspection, preventing the inspection result from being error due to the abnormal power apparatus. More specifically, the method of this embodiment comprises the following steps.

Step S30: the controller 401 turns off the switch 405 to disconnect the power unit 40 from the signal bus 41 to disable the effect of current-sharing.

Step S31: the controller 401 executes the state detection for detecting whether the power apparatus or the power unit 40 is operating normally. The state detection may comprise detecting whether the circuit component is faulty (such as whether the component is powered on, or the contact or the resistance value is abnormal), or whether the sensor is malfunctioning, etc.

Step S32: the controller 401 determines whether any error is detected, such as the failure of any component, or abnormal output voltage/current, etc.

If any error is detected by the controller 401, step S37 is executed: the controller 401 discontinues the execution of the performance inspection at this time, and outputs a notification (such as a notification that no performance inspection is executed).

If the controller 401 does not detect any error, step S33 is executed: the controller 401 gives the control command ICOM to the current control circuit. Then, the output current $I_{out\_1}$ is changed by the execution of the control command ICOM.

Step S34: the controller 401 measures the output current $I_{out\_1}$ responding to the control command ICOM.

Step S35: the controller 401 determines whether the output current Iout_1 reaches the default target current value for determining the inspection result of the performance inspection.

If the output current Iout_1 reaches the target current value, the controller 401 executes step S36: the controller 401 determines that the inspection result is normal performance, and outputs a notification (such as a notification of normal performance).

If the output current Iout_1 does not reach the target current value, the controller 401 executes step S38: the controller 401 determines that the inspection result of the power unit 40 is abnormal performance, and outputs a notification (such as a notification of abnormal performance).

The present disclosed example can effectively determine the result of the performance inspection of the power unit 40 based on whether the output current reaches the target current value.

In one of the exemplary embodiments, this embodiment may be modified to first execute the state detection (steps S31-S32), and disconnect the signal bus 41 (step S30) after no error is detected.

In one of the exemplary embodiments, this embodiment may be modified to first execute the state detection (steps S31-S32), disconnect the signal bus 41 (step S30) after no error is detected, and execute different state detection (steps S31-S32 being executed again).

The following description takes the power apparatus shown in FIG. 7 to explain the method shown in FIG. 11, but a person skilled in the art of the present disclosed example should be able understand that the method of this embodiment can be implemented by any of the power apparatuses shown in FIG. 4 to FIG. 7.

In comparison with the method shown in FIG. 10 which determines the performance of the power unit directly based on whether the output current reaches the target current value, this embodiment allows the user to configure the finer qualification conditions and finishing conditions for a more precise confirmation of the performance. More specifically, the method of this embodiment comprises following steps:

Step S40: the controller 401 controls the switch 405 to be an open circuit to disconnect the power unit 50 form the signal bus 51.

Step S41: the controller 401 executes the state detection on the power apparatus comprising the power unit 50. The state detection in this embodiment may be the same as or similar to the state detection in the FIG. 10.

Step S42: the controller gives the control command ICOM to the current control circuit. Then, the output current $I_{out\_1}$ is changed by the execution of the control command ICOM.

Step S43: the controller 41 measures the output current $I_{out\_1}$ responding to the control command ICOM.

Step S44: the controller 401 determines whether the output current (including the current variation and/or the degree of variation) meets default qualification conditions.

In one of the exemplary embodiments, the above-mentioned qualification conditions may comprise the output current $I_{out\_1}$ reaching the target current value (such as 85% of the rated current) within a response time (such as 200 milliseconds, the response time may be configured based on the type of the power unit 50). Namely, different types of the power units 50 respectively correspond to different response times.

In one of the exemplary embodiments, the above-mentioned qualification conditions may comprise the output current $I_{out\_1}$ reaching the target current value for a target continuous time (such as 200 milliseconds, the target continuous time may be configured based on the type of the power unit 50). Namely, different types of the power units 50 respectively correspond to different target continuous times.

In one of the exemplary embodiments, the above-mentioned response time is less than 0.5 seconds.

In one of the exemplary embodiments, the above-mentioned qualification conditions may comprise a number of times the output current $I_{out\_1}$ reaches the target current value in multiple measurements (such as 100 times) reaching a target number (such as 90% of the number of the measurements, namely, 90 times, and the target number may be configured based on the type of the power unit 50). Namely, different types of the power units 50 respectively correspond to different target numbers of times.

In one of the exemplary embodiments, the above-mentioned qualification conditions may comprise the output current $I_{out\_1}$ being less than the rated current of the power unit 50. The rated current (value) is greater than the target current value.

In one of the exemplary embodiments, the above-mentioned target current value is greater than 80% of the rated current value.

In one of the exemplary embodiments, the above-mentioned qualification conditions may comprise the output current $I_{out\_1}$ being less than the rated current value but not less than the target current value.

If the controller 401 determines that the output current meets the qualification conditions, step S45 is executed: the controller 401 determines that the power unit 50 passes the performance inspection, determines that the inspection result of this power unit 50 is normal performance, and outputs the corresponding notification or marking a record.

If the controller 401 determines that the output current does not meet the default qualification conditions, step S46 is executed: the controller 401 determines whether a finishing condition is met.

In one of the exemplary embodiments, the above-mentioned finishing condition may comprise a restriction time (such as 1 second) elapsing.

In one of the exemplary embodiments, the above-mentioned restriction time is greater than the above-mentioned response time and the above-mentioned target continuous time.

In one of the exemplary embodiments, the above-mentioned finishing condition may comprise repeatedly measuring for a restriction number of times (such as 300 times).

In one of the exemplary embodiments, the above-mentioned restriction number of times is larger than the above-mentioned target number of times.

If the controller 401 determines that the finishing condition is not met, step S41 is executed again.

In one of the exemplary embodiments, if the controller 401 determines that the finishing condition is not met, step S42 is executed, skipping the state detection step S41.

If the controller 401 determines that the finishing condition is met, but the qualification condition is not met, step S47 is executed: the controller 401 determines that the power unit 50 fails to pass the performance inspection, determines that the inspection result of the power unit 50 is abnormal performance, and outputs the notification or marking a record.

Compared with the method determining the performance of the power unit based on one inspection result, the present disclosed example can effectively improve the accuracy of inspection results via determining the inspection result based on multiple measurements.

Figure 13:
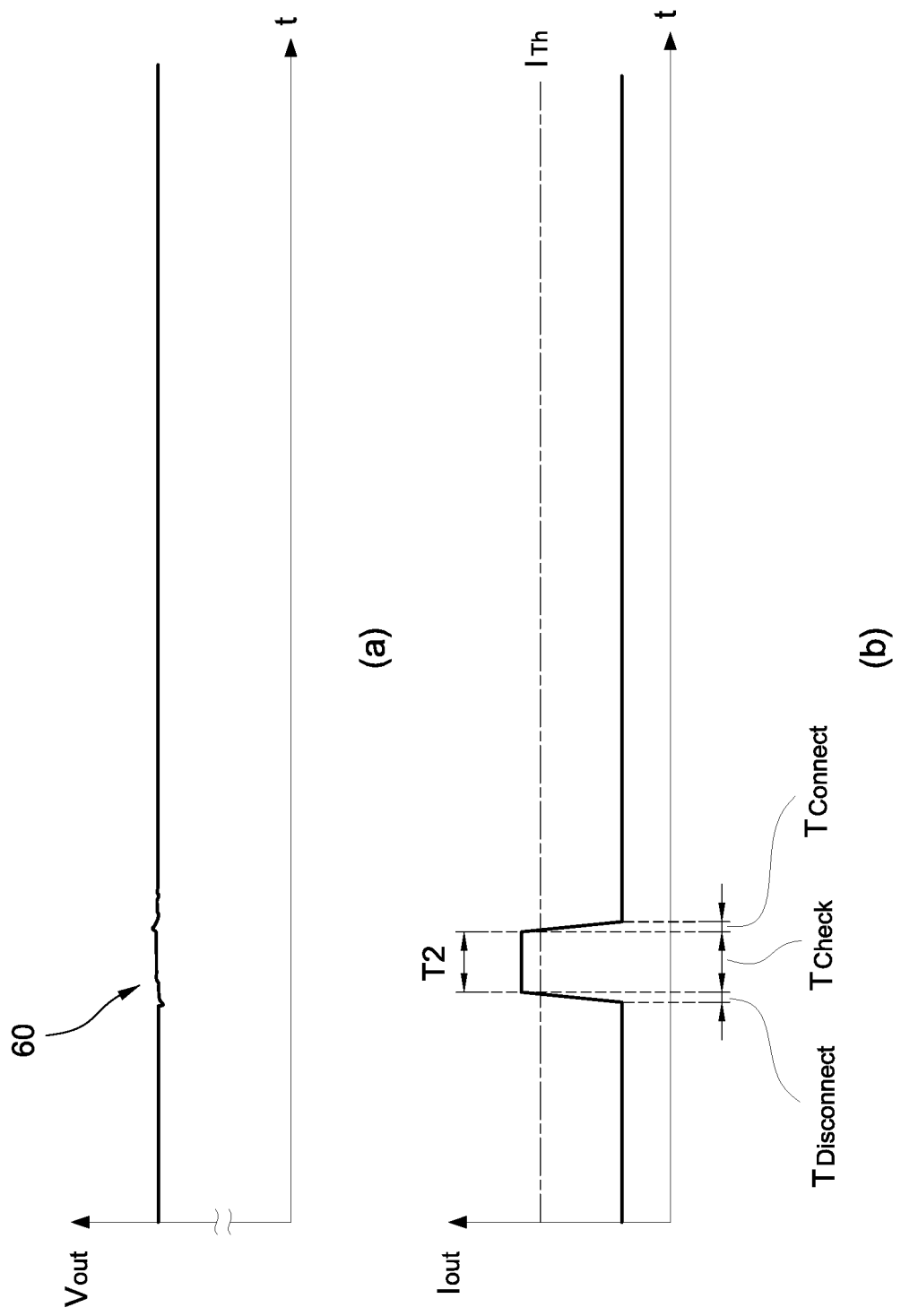
FIG. 13 illustrates a relation chart of output voltage and time, and a relation chart of output current and time of a power unit with normal performance of the present disclosed example.
Figure 14:
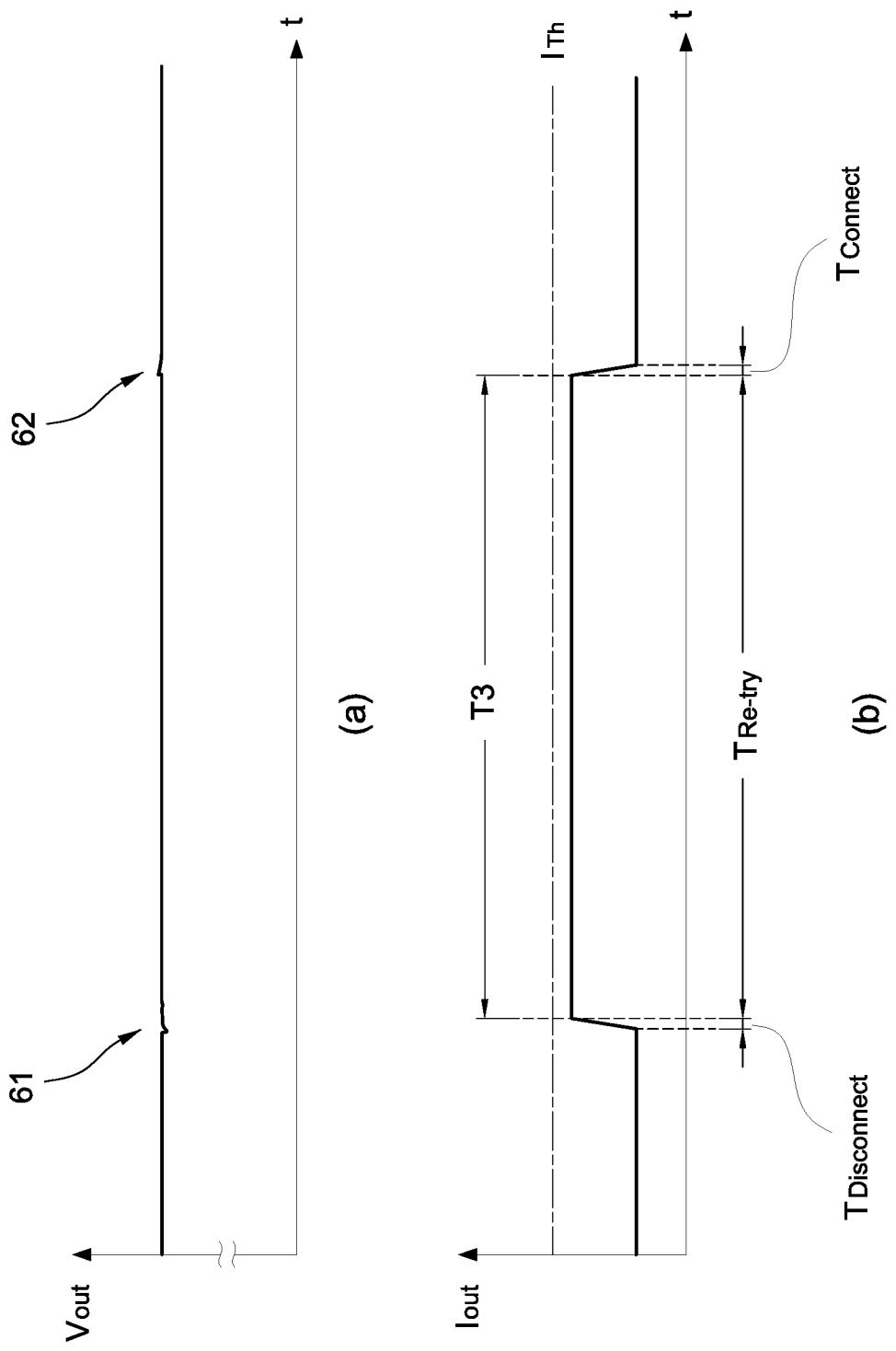
FIG. 14 illustrates a relation chart of output voltage and time, and a relation chart of output current and time of a power unit with abnormal performance of the present disclosed example.

Please refer to FIG. 13 and FIG. 14 together.

In this example, the qualification condition is the output current $I_{out}$ reaching the target current value $I_{TH}$, and keeping for the continuous time interval T2 (such as 300 milliseconds). The finishing condition is the output current $I_{out}$ failing to reach the target current value $I_{TH}$ for the continuous time interval T3 (such as 1.5 seconds).

As shown in FIG. 13, in the example of passing the performance inspection, the power unit takes the disconnecting time $T_{Disconnect}$ to be disconnected from the signal bus, receives the control command and raises the output current beyond the target current value $I_{TH}$, and keeps for the check time $T_{check}$ so as to be determined as normal performance, wherein the continuous check time $T_{Check}$ reaches the time interval T2. Then, the power unit takes the connecting time $T_{Connect}$ to be reconnected to the signal bus to finish the inspection.

In this example, the minimum inspection time is the total time of the disconnecting time $T_{Disconnect}$, the check time $T_{check}$ and the reconnecting time $T_{Connect}$. In general, this total time is far less than 10 seconds, and far less than the time required for existing method of inspecting power units.

As shown in FIG. 14, in the example of abnormal performance, the power unit takes the disconnecting time $T_{Disconnect}$ to be disconnected from the signal bus, receives the control command and raises the current, and continuously retries the process within the retry time $T_{Re-try}$ when the current does not reach the target current value $I_{TH}$ for a time period longer than the check time $T_{Check}$. If the retry time $T_{Re-try}$ elapses, and the output current is still unable to reach the target current value $I_{TH}$ (and keeps for the continuous time interval T2), the power unit is determined as abnormal performance. Then, the power unit takes the connecting time $T_{Connect}$ to be reconnected to the signal bus to finish the inspection.

In this example, the maximum inspection time is the total time of the disconnecting time $T_{Connect}$, the retry time $T_{Re-try}$ and the reconnecting time $T_{Connect}$. In general, this total time is far less than 10 seconds, and far less than the time required for existing method of inspecting power units.

Figure 12:
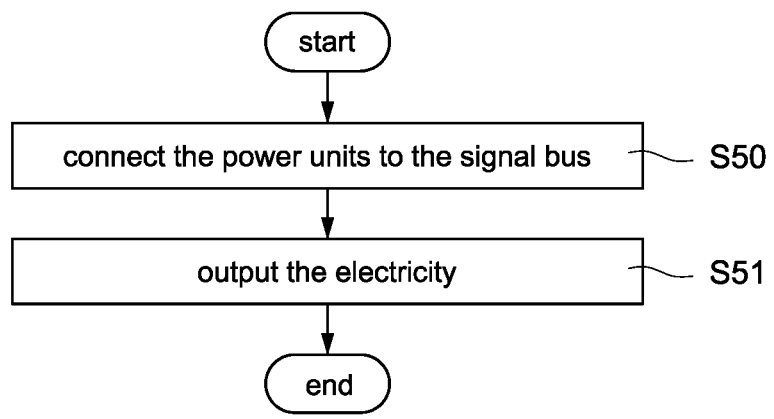
FIG. 12 illustrates a partial flowchart of the method of inspecting the power unit of the fifth embodiment of the present disclosed example.

The following example uses the power apparatus shown in FIG. 4 to explain the method shown in FIG. 12, but a person skilled in the art of the present disclosed example should be able to understand that the method of this embodiment can be implemented by any of the power apparatuses shown in FIG. 4 to FIG. 7. In comparison with FIG. 8 to FIG. 11, the method of this embodiment further explains how to use the signal bus to provide stable electricity. More specifically, the method of this embodiment comprises following steps:

Step S50: the power control module 201 in each power unit 20 is respectively connected to the signal bus 21, such as by switching the switch 203 on. After the connection is established, the output current (such as the $I_{out\_1}$, $I_{out\_2}$, ..., $I_{out\_n}$ shown in FIG. 6 or FIG. 7) outputted from each power unit 20 to the output port 22 is adjusted to the average current value of the power units 20 caused by the effect of current-sharing.

Step S51: the power output port 22 of the power apparatus outputs the electricity of the power units 20 effected by current-sharing, wherein the outputted total current value is a sum of the output current values of the power units 20.

With the above-mentioned embodiment for current sharing, the present disclosed example can provide a stable output of electricity.

What is claimed is:

1. A method of inspecting a plurality of power units connected to a signal bus, each of the power units comprising a power module and a controller, the method comprising following steps:
   a) disconnecting one of the power units from the signal bus, wherein the power unit being disconnected has an output current;
   b) providing a control command by the controller for raising the output current;
   c) measuring the output current after the control command is provided; and
   d) determining an inspection result of the power unit by comparing the measured output current with a target current value corresponding to the control command;
   wherein the signal bus is a current-sharing bus, each power unit further comprises a current control circuit and a voltage control circuit connected to each other, the controller is directly connected to the current control circuit and the voltage control circuit, and the signal bus is connected to the current control circuit through a switch;
   wherein the step a) comprises turning off the switch to disconnect the power unit from the signal bus.

2. The method according to claim 1, further comprising following step:
   e) selecting one of the power units without the inspection result to execute the step a) to step d).

3. The method according to claim 1, further comprising following steps to be executed before the step b):
   f1) executing a state detection on the power unit; and
   f2) skipping the execution of the step a) to the step d) and outputting a notification when any error is detected during the state detection.

4. The method according to claim 1, wherein the step d) comprises following steps:
   d1) determining that the inspection result of the power unit is normal when the measured output current reaches the target current value; and
   d2) determining that the inspection result of the power unit is abnormal when the measured output current fails to reach the target current value.

5. The method according to claim 1, wherein the step d) comprises following steps:
   d3) determining that the inspection result of the power unit is normal when determining that a qualification condition is met based on the measured output current; and
   d4) determining that the inspection result of the power unit is abnormal when determining that the qualification condition is not met based on the measured output current.

6. The method according to claim 5, wherein the qualification condition comprises the measured output current reaching the target current value within a response time, the measured output current reaching the target current value for a target continuous time, or a number of times that the measured output current reaching the target current value in multiple measurements reaching a target number.

7. The method according to claim 6, wherein the power units comprise different types of power units and respectively correspond to the different response time, the different target continuous time, or the different target number.

8. The method according to claim 6, wherein the qualification condition further comprises the measured output current being less than a rated current of the power unit; wherein the rated current is greater than the target current value.

9. The method according to claim 6, wherein the response time is less than 0.5 seconds, and the target current value is greater than 80% of a rated current of the power unit.

10. The method according to claim 5, wherein the step d4) comprises following steps:
    d41) determining that the inspection result of the power unit is abnormal when determining that the qualification condition is not met and a finishing condition is met; and
    d42) executing the step c) again when determining that the qualification condition is not met and the finishing condition is not met.

11. The method according to claim 10, wherein the finishing condition comprises a restriction time elapsing or repeatedly measuring the output current for a restriction number of times;
    wherein the restriction time is greater than a response time and a target continuous time, and the restriction number is greater than a target number.

12. The method according to claim 1, wherein the step c) comprises measuring a current at an output port of the power unit as the measured output current of the power unit, and providing a sensing signal of the measured output current to the current control circuit.

13. The method according to claim 1, wherein the power unit is a power supply, and the power module comprises a power stage; the step d) comprises comparing the measured output current with the target current value corresponding to the power supply.

14. The method according to claim 1, wherein the power module is a battery module and comprises a battery and a DC/DC converter; the step d) comprises comparing the measured output current with the target current value corresponding to the battery or the DC/DC converter.

15. The method according to claim 1, wherein the step a) comprises selecting one of the power units as an uninspected power unit, and turning off the switch connected to the uninspected power unit;

wherein the step b) comprises inputting the control command to the current control circuit of the uninspected power unit.

16. The method according to claim 15, further comprising:
- g1) turning on the switch connected to another power unit to connect the another power unit and the signal bus;
- g2) inputting a sensing signal of an output current of the another power unit to a super position circuit of the current control circuit of the another power unit to obtain a control signal for current-sharing;
- g3) inputting the control signal for current-sharing and the sensing signal of the output current to a differential amplifier of the current control circuit of the another power unit to obtain a comparison result; and
- g4) inputting the comparison result to the voltage control circuit of the another power unit to adjust an output voltage of the another power unit, such that the output current of the another power unit is changed;

wherein the control signal for current-sharing isn't inputted to the uninspected power unit connected to the switch being turned off.

17. The method according to claim 1, wherein the step b) further comprising:
- b1) inputting the control command and a sensing signal of the output current to a differential amplifier of the current control circuit to obtain a comparison result; and
- b2) inputting the comparison result to the voltage control circuit to adjust an output voltage, such that the output current is changed.

18. The method according to claim 17, wherein the step b2) comprises:
- b21) inputting the comparison result and a feedback voltage to a superposition circuit of the voltage control circuit to obtain a superimposed result;
- b22) inputting the superimposed result and a reference voltage to a differential amplifier of the voltage control circuit to obtain an error voltage; and
- b23) at the controller, adjusting the output voltage and the output current of the power unit based on the error voltage.

* * * * *